United States Patent [19]
Forgues

[11] Patent Number: 5,999,804
[45] Date of Patent: Dec. 7, 1999

[54] LOW NOISE QUADRATURE MIXER CIRCUIT

[75] Inventor: Scott L. Forgues, Tucson, Ariz.

[73] Assignee: National Semiconductor Corporation, Santa Clara, Calif.

[21] Appl. No.: 08/821,126

[22] Filed: Mar. 20, 1997

[51] Int. Cl.$^6$ .............. H04B 1/26; H03B 19/00; G06G 7/12; G06F 7/44

[52] U.S. Cl. .......... 455/333; 455/323; 455/326; 327/355; 327/359; 327/113

[58] Field of Search ................. 455/302, 318, 455/323, 326, 330, 333; 327/113, 355, 359; 330/296, 261, 311

[56] References Cited

U.S. PATENT DOCUMENTS

| | | | |
|---|---|---|---|
| 4,220,875 | 9/1980 | Lawton | 327/306 |
| 4,636,663 | 1/1987 | Jongepier et al. | 327/113 |
| 5,289,391 | 2/1994 | Ibrahim et al. | 375/316 |
| 5,521,545 | 5/1996 | Terry et al. | 455/326 |
| 5,826,182 | 10/1998 | Gilbert | 455/326 |

*Primary Examiner*—Dwayne D. Bost
*Assistant Examiner*—Raymond B. Persino
*Attorney, Agent, or Firm*—Skjerven, Morrill, MacPherson, Franklin & Friel LLP; Norman R. Klivans

[57] ABSTRACT

A low noise quadrature mixer circuit for RF has an input stage which is a single ended to differential converter, where the cascode transistors each include two transistors with common emitter and base connections and separate collector outputs. The separate collectors serve as current outputs to drive the switching stages of the mixer. With two current outputs from both the positive and negative sides of the single ended to differential converter, this drives the emitters of two separate sets of cross coupled emitter coupled pair transistors that make up the output switching stages of the mixer. With the two sets of cross coupled emitter coupled pairs, one set is driven by an in phase local oscillator signal and the other is driven by a quadrature local oscillator signal. The resulting output signals are two intermediate frequency (IF) differential voltage output signals that are in quadrature (90° out of phase with each other).

13 Claims, 2 Drawing Sheets

LOW NOISE QUADRATURE MIXER CIRCUIT

BACKGROUND OF THE INVENTION

1. Field of the Invention

This invention relates to circuitry for processing radio frequency signals and, more specifically, to a mixer circuit.

2. Description of the Prior Art

Mixer circuits ("mixers") are well-known in the electronics field and especially in the RF (radio frequency) field. A mixer converts a high frequency (RF) signal to a lower frequency, or as it is usually called, intermediate frequency (IF) signal which is more easily processed, in for instance by a radio receiver, for purpose of amplification. What is commonly called a mixer is more accurately a converter or frequency converter. (This disclosure uses the more common term mixer to avoid confusion with other types of converters.) Mixers perform similar functions in both transmitting and receiving circuits. Many types of mixers are known. An ideal mixer converts any input RF signal to another lower chosen frequency with no distortion and has a noise figure of 0 dB. Such a mixer, of course, does not exist. However, it is desirable to minimize noise generated by the mixer circuit. Typically a mixer receives a local oscillator (LO) signal of a fixed frequency generated by a local oscillator in the radio and also receives the RF signal, and converts the RF signal to a substantially lower IF frequency. The IF frequency is typically the difference between the RF signal frequency and local oscillator frequency. A conventional mixer, when used to demodulate an IF signal, demodulates any RF frequency either above and below the LO frequency down to the IF frequency. In other words, if the RF signal is at 260 MHz and the LO signal is at 250 MHz, a conventional mixer down converts the RF signal to 10 MHz, which is the difference between the RF frequency and LO frequency. This is a demodulation of the upper sideband and would be a desirable result. However, if there is also an RF signal present at 240 MHz, the conventional mixer will also down convert this signal to 10 MHz. This demodulation of the lower sideband is not desired in a single sideband radio system.

An image reject mixer is an application for a mixer. It demodulates the upper sideband of the RF signal down to an IF frequency, while rejecting the lower sideband, which are the RF signals below the local oscillator frequency. It can also do the reverse: demodulate lower sideband while rejecting the upper sideband, when configured properly. An image reject mixer is described in "Image Reject and Image Canceling Mixers" Pandula, RF Design, April, 1995, pp. 60 and following. This shows an image reject mixer with two mixer circuits with common RF input terminals and LO inputs that are in quadrature (90° apart in terms of phase). This is also known as a quadrature modulator or demodulator, and shows use of mixer circuits.

In general, it is well-known that any type of mixer circuit should have low noise, high dynamic range (both of the input and output signals), and an easily attained conversion gain and an easily supplied current level. It is known that for image reject mixers, noise is a particular problem because the two separate mixer circuits having common inputs tend to generate noise. Available mixer circuits do not provide adequate low noise performance for such applications.

SUMMARY

In accordance with this invention, a low noise quadrature mixer circuit includes an input stage which is a single-ended to differential converter receiving the RF signal and outputting four output signals, two output signals from each of two cascode single-ended to differential converter circuits. The output switching stages of the mixer circuit are two sets of cross coupled emitter coupled pairs of transistors. The first set receives the local oscillator input signal which is at 0° phase and the second set receives the local oscillator input signal which is in quadrature (90° out of phase). The output currents from the converter input stage are coupled to the two output switching stages so that there are two current output signals from each of the positive and negative sides of the single-ended to differential converter. Hence, the output switching stage which is driven by the local oscillator in phase signal outputs an RF signal which is in phase, and the output switching stage, which is driven by the local oscillator signal which is in quadrature, outputs an IF signal which is in quadrature.

The present mixer circuit is usable, e.g., as a portion of an image reject mixer, or in a standalone mode.

The input stage, which is a single-ended to differential converter, includes cascode transistors which in one embodiment each consist of two transistors with common emitter and base connections but separate collector outputs. Alternatively, the separation of the collectors is achieved by providing a single transistor with two separate collector connections. The collectors serve as current output terminals to drive the output switching stages of the mixer. Since there are two output signals from both the positive and negative sides of the single-ended to differential converter, these are able to drive the emitters of the two separate sets of cross coupled emitter coupled pairs in the two output switching stages. The resulting output signals from the output switching stages are two IF differential voltage output signals that are in quadrature (90° out of phase with one other).

DETAILED DESCRIPTION

Figure 1:
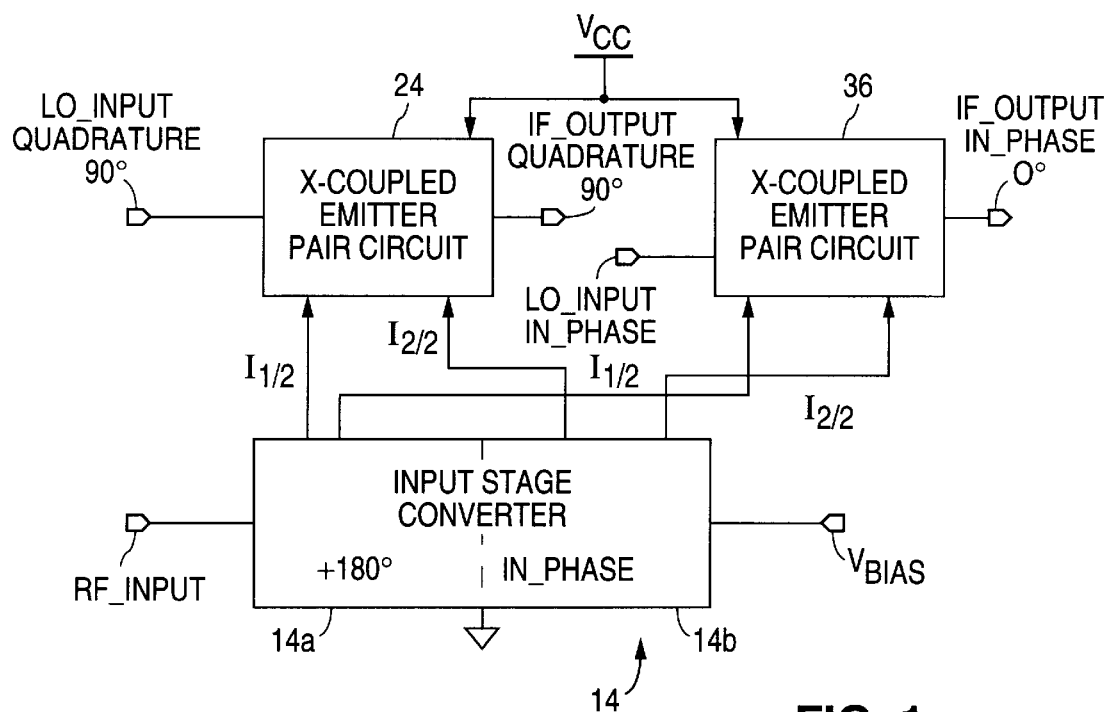
FIG. 1 shows in a block diagram a mixer circuit in accordance with this invention.

FIG. 1 shows in a block diagram a mixer circuit in accordance with this invention. The RF input signal, which is the signal to be converted to an intermediate frequency output signal, is applied at terminal RF_INPUT, which is the input terminal to a single-ended to differential converter input stage 14. Such converters in general are well-known in the field. Converter stage 14 provides four output signals. Two of the output signals, from portion 14b of converter stage 14, are in phase with the RF input signal, and two, from portion 14a of converter stage 14, are out of phase with the RF input signal by 180°, in this embodiment. One of the in phase signals and one of the out of phase signals is provided to each of the output switching stages, each of which is cross coupled emitter transistor pairs 24 and 36. The converter stage 14 is provided with a voltage bias at terminal VBIAS as described in further detail below, in one embodiment.

The cross coupled emitter pair circuits 24 and 36 are identical in terms of their internal structure. The first cross coupled emitter pair circuit 24 receives the local oscillator quadrature (90° out of phase) signal at terminal LO_INPUT QUADRATURE 90°. This signal is provided from a conventional local oscillator (not shown). (It is understood that the local oscillator frequency is a function of the desired intermediate frequency and the expected RF input frequency.) The output signal from the cross coupled emitter pair stage 24, which is coupled to a power terminal VCC, is provided as an IF quadrature output signal at terminal IF_OUTPUT QUADRATURE.

The second output switching stage 36 has applied to its input terminal LO_INPUT IN_PHASE 0° the local oscillator in phase (0°) signal. This second output switching stage 36 provides the intermediate frequency (IF) output signal on terminal IF_OUTPUT IN_PHASE.

The internal structures of each of the blocks shown in FIG. 1, in one embodiment, are conventional circuits of types well-known in the art.

Figure 2:
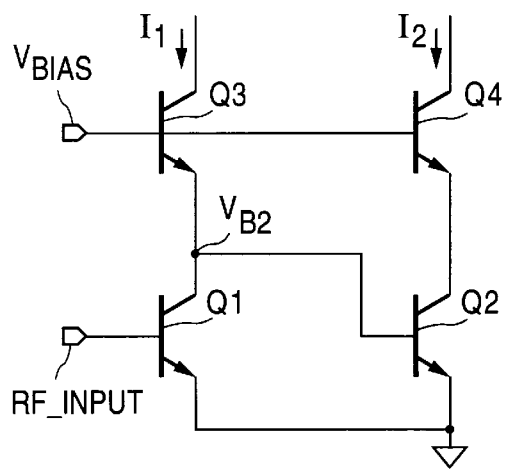
FIG. 2 shows a singled-ended to differential converter for the mixer circuit of FIG. 1.

In another embodiment, converter stage 14 is of the type shown in FIG. 2. FIG. 2 shows this converter generally; a specific circuit for use with the circuit of FIG. 1 is described in further detail below.

In the circuit of FIG. 2, a single (unbalanced) RF input signal at terminal RF_INPUT is converted to a differential (balanced) output signal I1, I2 resulting in high gain, low noise and improved output level in linearity. (It is to be understood that transistors Q1 through Q4 in FIG. 2 do not correspond exactly to similarly numbered transistors in FIG. 3). The input transistor Q1, the base of which the RF input signal is applied, in turn has its collector connected at node VB2 to the base of transistor Q2. A bias voltage VBIAS is coupled to the bases of each of transistors Q3 and Q4. This is a cascode type amplifier converter. In this circuit, the small signal gain is twice that of a standard differential transistor pair and the maximum output current has no limit. A converter of this type is described in commonly owned U.S. patent application Ser. No. 08/822,377 "Cascode Single-Ended to Differential Converter", filed Mar. 20, 1997, David E. Bien, incorporated herein by reference in its entirety.

Figure 3:
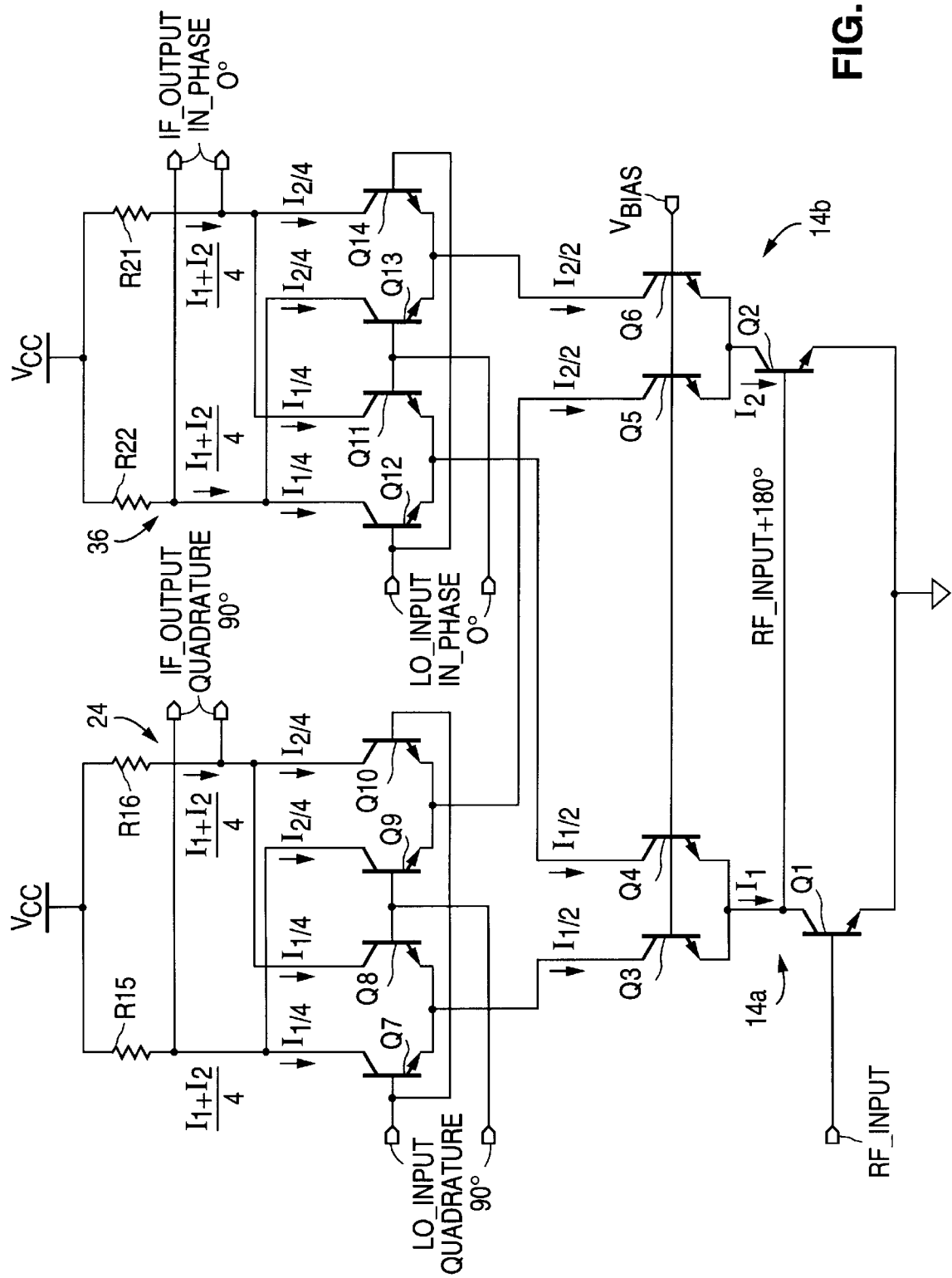
FIG. 3 shows detail of the mixer circuit of FIG. 1.

In FIG. 1 each of currents I1 and I2 of FIG. 2 is split into two equal subcurrents I1/2 and I2/2 and these subcurrents are coupled as shown to the two cross-coupled emitter pair circuits 24 and 36. (This splitting, shown below in FIG. 3, is accomplished by substituting two transistors for each of transistors Q3, Q4 in FIG. 2.) Thus as shown the converter stage 14 has two portions, a 0° portion 14b and a 180° portion 14a with respect to the phase of the RF input signal, where the current I2 is in phase with the RF input signal and the current I1 is 180° out of phase therewith.

The single-ended to differential converter stage of FIG. 2 advantageously has a lower inherent noise output than do prior art converters, coupled with higher gain and a wide dynamic range. By using this circuit as a single input stage with the variation of using split cascode transistors (two transistors in parallel in the cascode connection to separate collector outputs, as described further below) this converter has the benefit of low noise not only due to the inherent lower noise of the cascode single-ended to differential converter, but also the low noise benefit of having a mixer circuit that acts as two separate mixers with a common input stage.

Hence it can be seen that in one variation the circuit of FIG. 1, instead of using this single input converter stage, uses two separate conventional input stages to provide the desired drive currents.

FIG. 3 shows detail of one version of the circuit of FIG. 1. The input converter stage 14a in FIG. 3 includes transistors Q1, Q3, Q4. Input converter stage 14b includes transistors Q2, Q5 and Q6. The RF input signal is applied to the base of transistor Q1, the collector of which is coupled to the base of transistor Q2. In this case the cascode transistors, which are transistors Q3 through Q6, each consist of two transistors i.e. the paired transistors Q3, Q4 and the pair Q5, Q6 with common emitter and base connections but separate collector outputs. Hence transistor pair Q3, Q4 of FIG. 3 corresponds to single transistor Q3 of FIG. 2, and transistor pair Q5, Q6 of FIG. 3 corresponds to single transistor Q4 of FIG. 2. The separation of collectors is achieved in one embodiment by connecting two separate transistors, as shown in FIG. 3. In another embodiment (not shown) the transistor pair Q3 and Q4 is a single transistor with two collector output terminals. The separate collectors, however achieved, serve as separate output terminals to drive the output switching stages of the mixer circuit by producing the two equal currents I1/2 from respectively transistors Q3 and Q4 and the two equal currents I2/2 from transistors Q5 and Q6. These currents drive the output switching stages in the upper part of FIG. 3 (blocks 24 and 36 in FIG. 1). Hence block 24 of FIG. 1 is represented by transistors Q7 through Q10 and resistors R15 and R16 in FIG. 3. As shown in FIG. 3, current (I1+I2)/4 is sourced to each transistor pair Q7 to Q14, and each of these transistors draws current I1/4 or I2/4. The second cross-coupled emitter pair circuit 36 of FIG. 1 is represented in FIG. 3 by transistors Q11 through Q14 and resistors R21 and R22.

With two current outputs for both the positive and negative portions of the single-ended to differential converter stage, shown as 14a and 14b in FIG. 1, it is possible to drive the emitters of the two separate sets of cross-coupled emitter coupled pairs. The first set of pairs is transistors Q7, Q8 and Q9, Q10. The second set of pairs transistors Q11, Q12 and Q13, Q14. The set which is transistors Q11 through Q14 is driven at its input terminal LO_INPUT IN_PHASE 0° by the local oscillator (LO) input signal which is in phase, i.e. at phase 0° as shown. The other set which is transistors Q7 through Q10 is driven at its input terminal by LO_INPUT QUADRATURE 90° by the local oscillator quadrature input signal which is 90° out of phase, as shown. Using the well known multiplying principle as found for instance in the conventional Gilbert cell multiplier, the resulting IF output signals at terminals IF_OUTPUT QUADRATURE and IF_OUTPUT IN_PHASE are two different IF differential voltage output signals that are in quadrature, i.e. 90° out of phase with one another as shown.

The resistors R15, R16, R21 and R22 provide the differential voltage outputs. The resistor values are not critical. In other cases the cross-coupled collectors could be also used as current outputs. The cross coupled collectors are basically current outputs. By connecting resistors between the collectors and VCC, a voltage is developed across the resistors to obtain a voltage output. Without the resistors, the collectors could just be used as current outputs to drive another circuit that uses a differential current input, e.g. a transimpedence amplifier.

Figure 4:
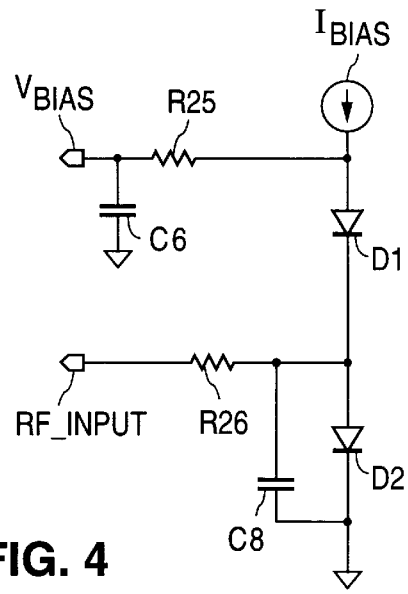
FIG. 4 shows a bias circuit for use in conjunction with the mixer circuit of FIGS. 1 and 2.

The biasing voltage supplied to terminal VBIAS shown in FIG. 3 in one embodiment is provided by a circuit shown in FIG. 4. This particular bias circuit contributes to the proper operation, i.e. low noise, of this mixer circuit. It is especially important to suppress noise in the input stage 14. Particularly, the present inventor has found that applying biasing at both the RF_INPUT and the VBIAS terminals of FIGS. 1 and 3 should be such that the base-to-emitter voltages of transistors Q1 and Q2 in FIG. 3 are close to being equal. This helps to provide equal but 180° out of phase transconductance gains through the single ended to differential converter 14 of FIGS. 1 and 3. The cross-coupled nature of the circuit inherent between both the single ended to differential converter stage 14 and the output switching stages 24 and 36 helps to overcome any bias current mismatches that could result. As seen in FIG. 3, the bias currents through each of the collector resistors R15, R16 and R21, R22 are the same regardless of whether or not the bias currents in transistors Q1 and Q2 are exactly matched. This is advantageous since the bias match between transistors Q1 and Q2 is the most difficult to achieve since the bias is dependent on how the bias is set at the RF_INPUT and VBIAS terminals.

A reasonable match is achieved using the bias circuit of FIG. 4 which includes two diode devices D1 and D2 each acting as the reference side of a current mirror, with the lower mirror (diode D2) connected through resistor R26 to the base of transistor Q1 of FIG. 3, i.e. the RF_INPUT terminal. The top mirror (diode D1) is connected through resistor 25 to the VBIAS terminal of FIG. 3. The IBIAS current source in FIG. 4 is a conventional current source driven by voltage supply VCC of FIG. 3. Capacitors C6 and C8 (each, e.g. 10 pF) are each connected to ground for filtering purposes, to isolate the VBIAS terminal from the RF input AC signal. Diode devices D1 and D2 shown in FIG. 4 in one embodiment are conventionally diode connected transistors, i.e. their collector is connected to the base at the upper terminal. Of course this is not limiting and one may substitute other types of diode devices.

Matching of resistor sizes and transistor sizes between transistors Q1, Q2 and the bias circuit diodes D1, D2 helps to achieve the match. In addition, the common mode DC bias for the LO input signals to the output switching stages 24 and 36 are set so as not to saturate any of the transistors in the mixer circuit. The common mode bias of the LO input signals are applied at the transistor bases (e.g. Q7–Q10 of stage 24). Therefore, the emitters of transistors Q7–Q10 will be at voltage VLO_COMMON_MODE −VBE (meaning the common mode voltage of the local oscillator LO less the base-emitter voltage drop across each transistor Q7 to Q14. If voltage VLO_COMMON_MODE −VBE is lower than voltage VBIAS as applied to transistors Q3 and Q4 of stage 14a, then transistors Q3 and Q4's base collector junctions will become forward biased and saturation of transistors Q3, Q4 will result.

It has been found that transistor size matching is advantageous between the following sets of transistors (see FIG. 3), with the matched sets of transistors shown within parentheses: (Q1, Q2), (Q3, Q4, Q5, Q6), (Q7, Q8, Q9, Q10), and (Q11, Q12, Q13, Q14). Of course this is relatively easy to achieve in an integrated circuit implementation. It is to be appreciated however that the circuit of FIGS. 3 and 4 need not be an integrated circuit, but may be of discrete components. Also while this circuit is shown using bipolar (NPN) transistors in FIG. 3 this is not limiting and FET transistors may be substituted.

This disclosure is illustrative and not limiting; further modifications will be apparent to one skilled in the art in the light of this disclosure and are intended to fall within the scope of the appended claims.

I claim:

1. A mixer circuit comprising:

an input stage having a terminal for receiving an RF input signal and that converts the RF input signal to first and second differential current output signals;

a first emitter coupled transistor pair circuit coupled to receive the first differential output signal, and to receive a first time varying reference signal; and a second emitter coupled transistor pair circuit coupled to receive the second differential signal, and to receive a second time varying reference signal out of phase with the first time varying reference signal by a predetermined amount, whereby the first and second emitter coupled transistor pair circuits each output an intermediate frequency signal;

wherein the input stage has a biasing terminal coupled to a biasing circuit, the biasing circuit including first and second diodes series connected between a current source and ground, the RF input terminal being coupled to a node between the first and second diodes, and the biasing terminal of the input stage being coupled to a node between the current source and the first diode.

2. The mixer circuit of claim 1, wherein the input stage is a single ended to differential converter, converting the RF input signal to the first and second differential output signals.

3. The mixer circuit of claim 2, wherein the input stage includes two split cascode transistor circuits, outputting respectively the first and second differential output signals.

4. The mixer circuit of claim 3, wherein each split cascode transistor circuit includes two transistors having common base and emitter connections and separate collector output terminals.

5. The mixer circuit of claim 3, wherein each split cascode transistor circuit includes a single transistor with two collector connections.

6. The mixer circuit of claim 2, wherein the differential converter outputs four signals, two of which are in phase with the RF input signal and two of which are 180° out of phase with the RF input signal, one of the in-phase signals and one of the out of phase signals being coupled to each of the emitter coupled transistors pair circuits.

7. The mixer circuit of claim 1, wherein the first and second differential out put signals are 180° out of phase with one another.

8. The mixer circuit of claim 1, wherein each of the first and second emitter coupled transistor pair circuits includes two cross-coupled pairs of transistors.

9. The mixer circuit of claim 8, wherein all four transistors in each of the first and second emitter coupled transistor pair circuits are matched in size.

10. The mixer circuit of claim 1, wherein the predetermined amount of the phase difference is 90°.

11. The mixer circuit of claim 1, wherein the RF input node is coupled to the node by a resistance, and the biasing terminal is coupled to the node by a resistance.

12. The mixer circuit of claim 1, wherein the first and second time varying reference signals are each provided from a local oscillator.

13. A method of producing an intermediate frequency signal from a higher frequency RF input signal, comprising the steps of:

providing first and second time varying reference signals, which are out of phase with one another by 90°;

converting the RF input signal to two differential pairs of signals, the two differential pairs of signals being out of phase with one another by 180°;

mixing the first time varying reference signal with a signal from each of the pairs of differential signals, thereby producing a first intermediate frequency signal; and mixing the second time varying reference signal with a signal from each of the pairs of differential signals, thereby producing a second intermediate frequency signal, wherein the first and second intermediate frequency signals are out of phase with one another by 90°; and wherein the step of converting is carried out by an input stage having a biasing terminal coupled to a biasing circuit, the biasing circuit including first and second diodes series connected between a current source and ground, an RF input terminal where the RF input signal is applied being coupled to a node between the first and second diode, and the biasing terminal of the input stage being coupled to anode between the current source and the first diode.

* * * * *